1

United States Patent
Mulders et al.

(10) Patent No.: US 8,796,646 B2
(45) Date of Patent: Aug. 5, 2014

(54) BEAM-INDUCED DEPOSITION AT CRYOGENIC TEMPERATURES

(75) Inventors: Johannes Jacobus Lambertus Mulders, Eindhoven (NL); Petrus Hubertus Franciscus Trompenaars, Tilbrug (NL)

(73) Assignee: Fei Company, Hillsboro, OR (US)

( * ) Notice: Subject to any disclaimer, the term of this patent is extended or adjusted under 35 U.S.C. 154(b) by 472 days.

(21) Appl. No.: 13/172,596

(22) Filed: Jun. 29, 2011

(65) Prior Publication Data

US 2012/0003394 A1    Jan. 5, 2012

(30) Foreign Application Priority Data

Jun. 30, 2010 (EP) .................................... 10167905

(51) Int. Cl.
*H01J 37/30* (2006.01)
(52) U.S. Cl.
USPC ........ 250/492.1; 427/551; 427/553; 427/585; 427/590; 250/492.21; 250/492.3; 250/306
(58) Field of Classification Search
USPC ................. 427/551, 553, 532, 525, 585, 590; 250/492.1, 492.2, 492.21, 492.3
See application file for complete search history.

(56) References Cited

U.S. PATENT DOCUMENTS

| | | | |
|---|---|---|---|
| 3,622,781 A | 11/1971 | Liebl | |
| 4,770,940 A | 9/1988 | Ovshinsky et al. | |
| 5,190,807 A * | 3/1993 | Kimock et al. | 428/216 |
| 5,221,844 A | 6/1993 | van der Mast et al. | |
| 5,618,619 A | 4/1997 | Petrmichl et al. | |
| 5,679,413 A | 10/1997 | Petrmichl et al. | |
| 6,451,389 B1 | 9/2002 | Amann et al. | |
| 6,464,891 B1 * | 10/2002 | Druz et al. | 216/67 |
| 6,570,170 B2 * | 5/2003 | Moore | 250/492.21 |
| 6,818,257 B2 | 11/2004 | Amann et al. | |
| 6,926,935 B2 * | 8/2005 | Arjavac et al. | 427/596 |
| 7,034,315 B2 | 4/2006 | Henstra et al. | |
| 7,504,182 B2 | 3/2009 | Stewart et al. | |
| 7,670,956 B2 | 3/2010 | Bret et al. | |
| 7,845,245 B2 | 12/2010 | Hayles et al. | |
| 2003/0168606 A1 | 9/2003 | Adamec et al. | |
| 2010/0032567 A1 | 2/2010 | Maclou Botman et al. | |
| 2010/0159370 A1 | 6/2010 | Jong et al. | |
| 2010/0197142 A1 | 8/2010 | Randolph et al. | |
| 2010/0224592 A1 | 9/2010 | Toth et al. | |
| 2010/0255213 A1 | 10/2010 | Faber et al. | |
| 2011/0031655 A1 | 2/2011 | Toth et al. | |
| 2011/0070381 A1 | 3/2011 | Toth et al. | |
| 2011/0114665 A1 | 5/2011 | Chandler et al. | |
| 2011/0115129 A1 | 5/2011 | Straw et al. | |
| 2012/0003394 A1 | 1/2012 | Mulders et al. | |

FOREIGN PATENT DOCUMENTS

WO    W09738355    10/1997

OTHER PUBLICATIONS

Smith, Effect of Surface Coverage and Temperature on the Sticking Coefficient. Journal of Chemical Physics, vol. 40, 1964.*
Sun et al. Electron Beam Induced Carbon deposition and Etching. Materials Research Society Symp. Proc. vol. 750 (2003).*
Bozso, F., et al., 'Electronic Excitation-Induced Surface Chemistry and Electron-Beam-Assisted Chemical Vapor Deposition,' Mat. Res. Soc. Symp. Proc., 1990, pp. 201-209, vol. 158.
Ding, Xu-Li, et al., 'Optical and Electrical Properties Evolution of Diamond-Like Carbon Thin Films with Deposition Temperature,' Chin. Phys. Lett., Feb. 1, 2009, 8 pgs., vol. 26, No. 2.
Lifshitz, Y., et al., 'The Influence of Substrate Temperature During Ion Beam Deposition on the Diamond-like or Graphitic Nature of Carbon Films,' Diamond and Related Materials, 1993, pp. 285-290, vol. 2.
Unknown, "Cryo-Electron Microscopy," BBC, Jan. 2003, website, 17 pgs.
Won, You-Yeon, "Imaging Nanostructured Fluids Using Cryo-TEM," Korean J. Chem. Eng., 2004, pp. 296-302, vol. 21, No. 1.
Sehrbrock, Angelika, et al., "Preparation of Cryo-TEM Lamellae by Focused Ion Beam Milling," date unknown, 1 pg.
Scipioni, Larry, et al. 'Applications of the Helium Ion Microscope,' Microscopy Today, Nov. 2007, pp. 12-15.
Plies, Erich, et al., 'Proposal of a Novel Highly Symmetric Wien Filter Monochromator,' Microscopy and Microanalysis, Sep. 2003, pp. 28-29.
Uhlemann, S., et al. 'Experimental Set-Up of a Fully Electrostatic Monochromator for a 200 kV TEM,' Proceedings of 15th International Congress on Electron Microscopy, session 5/S14, Durban, South Africa, Sep. 1-6, 2002, 2 pages.

(Continued)

*Primary Examiner* — Dah-Wei D Yuan
*Assistant Examiner* — Jose Hernandez-Diaz
(74) *Attorney, Agent, or Firm* — Scheinberg & Associates, PC; Michael O. Scheinberg

(57) ABSTRACT

A method of depositing material onto a substrate at cryogenic temperatures using beam-induced deposition. A precursor gas is chosen from a group of compounds having a melting point that is lower than the cryogenic temperature of the substrate. Preferably the precursor gas is chosen from a group of compounds having a sticking coefficient that is between 0.5 and 0.8 at the desired cryogenic temperature. This will result in the precursor gas reaching equilibrium between precursor molecules adsorbed onto the substrate surface and precursor gas molecules desorbing from the substrate surface at the desired cryogenic temperature. Suitable precursor gases can comprise alkanes, alkenes, or alkynes. At a cryogenic temperature of between −50° C. and −85° C., hexane can be used as a precursor gas to deposit material; at a cryogenic temperature of between −50° C. and −180° C., propane can be used as a precursor gas.

19 Claims, 5 Drawing Sheets

(56) References Cited

OTHER PUBLICATIONS

Braun, Alexander, 'Does SEM Have a Future?' Semiconductor International, Dec. 2007, p. 51.
Basgall, R.J., et al., 'Cryo-Focused Ion Beam Preparation on Biological Materials for Retrieval and Examination by Cryo-TEM,', Microscopy and Microanalysis, Jul. 31, 2006, pp. 1132-1133, vol. 12.
Benner, Gerd, et al., 'Design and First Results of SESAM,' http://www.zeiss.com/C1256E4600307C70/EmbedTitelIntern/design_and_first_results_of_sesam/$File/design_and_first_results_of_sesam.pdf, 2003.
Lobo, Charlene, et al., 'High Resolution Radially Symmetric Nanostructures from Simultaneous Electron Beam Induced Etching and Deposition,' Nanotechnology, Dec. 6, 2007, 6 pp., vol. 19.
Toth, Milos, et al., 'Electron Flux Controlled Switching Between Electron Beam Induced Etching and Deposition,' Journal of Applied Physics, Mar. 7, 2007, 6 pp., vol. 101.

\* cited by examiner

BEAM-INDUCED DEPOSITION AT CRYOGENIC TEMPERATURES

TECHNICAL FIELD OF THE INVENTION

The invention relates to electron and ion beam induced deposition, and more particularly to beam-induced deposition at cryogenic temperatures.

BACKGROUND OF THE INVENTION

In the prior art, it is known to deposit a material onto a substrate via electron beam induced deposition (EBID) and ion beam induced deposition (IBID). According to the known method, a substrate is placed in the evacuable specimen chamber of a charged particle beam apparatus—typically either an electron beam (E-beam) system or a focused ion beam (FIB) system. The charged particle (or other) beam is applied to the substrate surface in the presence of a deposition gas, often referred to as a precursor gas. A layer of the precursor gas adsorbs to the surface of the work piece. The thickness of the layer is governed by the balance of adsorption and desorption of the gas molecules on the substrate surface, which in turn depends on, for example, the partial gas pressure (determining how many molecules are adsorbed per second), and the sticking coefficient (describing how long, on average, a molecule is adsorbed to the surface). The resultant layer is typically formed of less than one to several monoatomic layers.

When the charged particle beam irradiates the substrate with the adsorbed layer of precursor gas, secondary electrons are emitted from the substrate. These secondary electrons cause a dissociation of the adsorbed precursor gas molecules. Part of the dissociated precursor material forms a deposit on the substrate surface, while the rest of the precursor gas particle forms a volatile by-product and is pumped away by the vacuum system of the apparatus.

Beam induced deposition is used in a wide variety of applications for depositing a material onto a target surface of a substrate such as a semiconductor wafer or magnetic storage media. The materials are deposited for a variety of reasons such as to form patterned thin-film surfaces, protective coatings for semiconductor feature characterization and analysis, or to "weld" small samples, such as TEM samples, to a manipulator or sample holder (as described in more detail below). Many combinations of gasses, substrates, and beam types can be used to achieve a variety of deposition schemes. The particular material to be deposited will usually depend on the application, underlying target surface, and how the material reacts with the target surface. Similarly, a variety of beam types can be used to generate secondary electrons. These include ion, electron, and laser beams.

A disadvantage of known beam induced deposition methods is that they do not work well at cryogenic temperatures (below −50° C., more specifically below −130° C.). A number of applications, including the preparation of TEM samples of biological materials, require samples to be cooled to cryogenic temperatures. For example, to preserve the structural integrity of biological samples in the low-pressure environment of a TEM sample chamber, samples are often vitrified to avoid dehydration. Vitrification involves the process of cooling the sample so rapidly that the water molecules within the sample do not crystallize, but stay in an amorphous or vitrified state that does little or no damage to the sample structure. Vitreous ice is also featureless and does not form destructive ice crystals. The low temperature of the vitrified sample also may reduce the damage caused by beam electrons during observations, permitting more or longer exposures at higher beam currents for better quality images. To maintain the biological sample in its vitrified state, the temperature must be maintained below −130° C. (the so-named vitrification temperature), if the temperature rises above this level, the crystals change from amorphous to crystalline ice, which destroys the biological information in the cell or tissue.

At cryogenic temperatures, normal EBID/IBID processes do not work. Instead of reaching equilibrium where, for example, at most two monolayers of molecules are adsorbed on the substrate surface, the precursor gas molecules freeze onto the substrate and stay there (—that is: either the sticking coefficient goes to 1 or the lingering period goes to ∞—). This results in a thickening frozen layer of gas molecules covering the surface, making it difficult for the charged particle beam to cause dissociation of the precursor molecules and preventing any deposited material from bonding to the substrate surface resulting in an unreliable bond when used to attach a sample to a manipulator or holder. Further, the typical "volatile by-products" also freeze onto the surface at these low temperatures and may also disturb the formation of the bond. Also, when the sample is at a later stage brought up to a temperature above the melting, sublimation or boiling point of the, then suddenly volatile, by-products, can lead to damage of the intended structure. As a result, it will be hard or impossible to write patterned thin film surfaces on the sample.

Bozso et al., "Electronic Excitation-Induced Surface Chemistry and Electron-Beam-Assisted Chemical Vapor Deposition, Mat. Res. Soc. Symp. Proc., Vol. 158, pp. 201-209 (1990) describes a method of depositing silicon, silicon nitride, silicon oxide, and silicon oxinitride films onto a silicon substrate using low energy EBID at a temperature of approximately 100 K (−173° C.). The deposition method of Bozso, however, is used to separate dissociation reactions caused by electrons from those caused by heat for more precise control over spatial growth and material composition. As a result, Bozso describes adjusting the sample temperatures to achieve a desired deposition. This is not practical for preparation of TEM samples of biological materials since the samples must be maintained below the vitrification temperature to avoid damaging the biological sample. Further, the method described by Bozso is limited to depositing silicon, silicon nitride, silicon oxide, and silicon oxinitride films onto silicon. The use of the silicon substrate plays a dominant role in the absorption and surface chemistry of the reacting molecules. For preparation of TEM samples of biological materials it is desirable that the deposition method work on biological substrates and ice and be able to deposit non-silicon based materials such as carbon. Finally, the method described by Bozso teaches the use of low-energy electron beam excitation (~200 eV) to induce deposition in order to maintain both spatial and kinetic control. The material deposition rates would thus be impractical for sample welding or even for forming thicker/larger protective layers.

Therefore, there is a need for an improved method of beam-induced deposition that can be used at cryogenic temperatures in much the same way that typical EBID/IBID processes are used at temperatures above −50° C., more specifically above −130° C. There is a further need for an improved method of selecting a suitable precursor gas for beam-induced deposition at cryogenic temperatures.

SUMMARY OF THE INVENTION

An object of the invention is to provide an improved method of depositing material onto a substrate at cryogenic temperatures using beam-induced deposition. A precursor gas is preferably chosen from a group of compounds having a melting point that is lower than the cryogenic temperature of the substrate. A suitable precursor gas should have a sticking coefficient that is between 0 and 1, more specifically between 0.5 and 0.8 at the desired cryogenic temperature. This will result in the precursor gas reaching equilibrium between precursor molecules adsorbed onto the substrate surface and precursor gas molecules desorbing from the substrate surface at the desired cryogenic temperature before more than a small number of monolayers of the gas are formed. According to preferred embodiments of the present invention, suitable precursor gases can comprise alkanes, alkenes, or alkynes, or the branch derivatives of those compounds.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

A disadvantage of known beam induced deposition methods is that they do not work well at cryogenic temperatures, while a number of applications, including the preparation of TEM samples of biological materials, require samples to be maintained at those cryogenic temperatures, generally from −50° C. to −130° C. While beam systems with cryogenic chambers are known in the art, maintaining the sample chamber at cryogenic temperatures creates problems for EBID or IBID in the system, as the precursor gases tend to freeze to the TEM sample chamber. At temperatures below −50° C. most known precursor gases suitable for beam-induced deposition freeze onto the substrate surface and the normal EBID/IBID processes do not work.

At the normal operating temperatures for beam-induced deposition, most known precursor gases have a sticking coefficient between 0.5 and 0.8. "Sticking coefficient" describes the ratio of the number of adsorbate molecules (or atoms) that adsorb, or "stick," to a surface to the total number of molecules that impinge upon that surface during the same period of time. Sometimes the symbol $S_c$ is used to denote this coefficient, and its value is between 1.00 (all impinging atoms stick) and 0.00 (none of the atoms stick). Significantly, the coefficient is inversely proportional to the exponential of the temperature and also inversely proportional to the square of the distance between atomic steps on the surface of a crystalline material.

Thus, when the temperature is cooled to below −50° C., the sticking coefficient for most known precursor gases approaches 1.0 and instead of forming the desired equilibrium with less than one to a few monolayers of gas molecules adsorbed on the substrate surface, results in the formation of a frozen film with a rapid growth rate, which does not allow for local beam induced deposition.

Inventors have discovered that in order to be useful as a precursor gas for deposition at cryogenic temperatures, the precursor gas adsorbed onto the substrate surface must reach equilibrium (with the gas desorbing from the surface) at the desired sample temperature—for example, −130° C. or colder—before more than a small number of monolayers are formed, preferably when only less than one to two monolayers are formed. If more than a few monolayers are formed, the film of precursor gas molecules will keep growing. Preferably, a precursor gas molecule that can be used for deposition under cryogenic temperatures will have a sticking coefficient that is greater than 0 and less than 1.0 at the desired sample temperature; more preferably, the sticking coefficient will be between 0.5 and 0.8.

Figure 1:
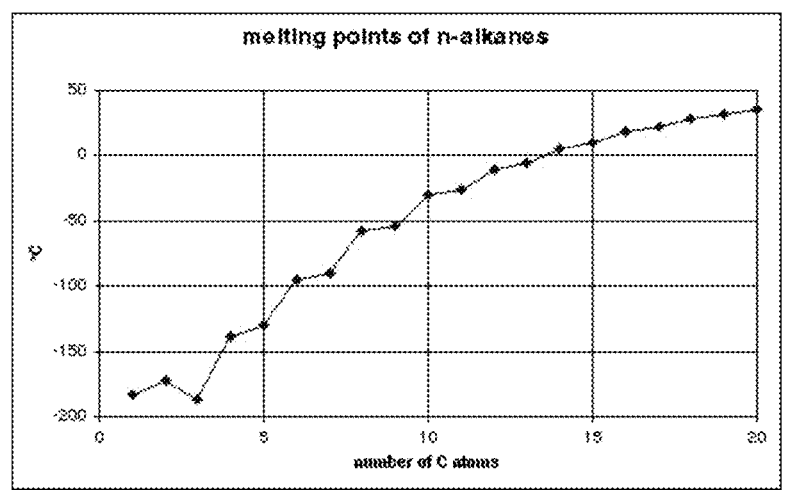
FIG. 1 is a graph showing the melting points of alkanes versus the number of carbon atoms in the compound.

Inventors have also discovered that the melting point of a compound can be used as a good predictor of the sticking coefficient at a desired cryogenic temperature, although the relationship is not always linear. For example, carbon-based alkanes, alkenes, and alkynes (along with branch derivatives of those compounds) are composite molecules that can be used to deposit carbon when exposed to a charged particle beam. Carbon is especially useful for forming protective layers or for "welding" a sample to a probe or sample holder. Alkanes with shorter primary C-chains have lower melting points than typical beam deposition precursor gases. FIG. 1 is a graph showing the melting points of alkanes versus the number of carbon atoms in the compound. As shown in the chart, as the number of carbon atoms increases, the melting point rises in an almost linear relationship. The following table shows various alkanes by chemical formula, melting point, and boiling point.

TABLE 1

| Name | Formula | Melting Point (° C) | Boiling Point (° C) |
| --- | --- | --- | --- |
| Methane | $CH_4$ | −182 | −161 |
| Ethane | $C_2H_6$ | −183 | −88 |
| Propane | $C_3H_8$ | −188 | −42 |
| Butane | $C_4H_{10}$ | −138 | 0 |
| Pentane | $C_5H_{12}$ | −130 | 36 |
| Hexane | $C_6H_{14}$ | −95 | 69 |
| Heptane | $C_7H_{16}$ | −90 | 99 |
| Octane | $C_8H_{18}$ | −57 | 126 |

TABLE 1-continued

| Name | Formula | Melting Point (° C) | Boiling Point (° C) |
| --- | --- | --- | --- |
| Nonane | $C_9H_{20}$ | −53 | 151 |
| Decane | $C_{10}H_{22}$ | −29 | 174 |
| Eicosane | $C_{20}H_{42}$ | 37 | 344 |

Figure 2:
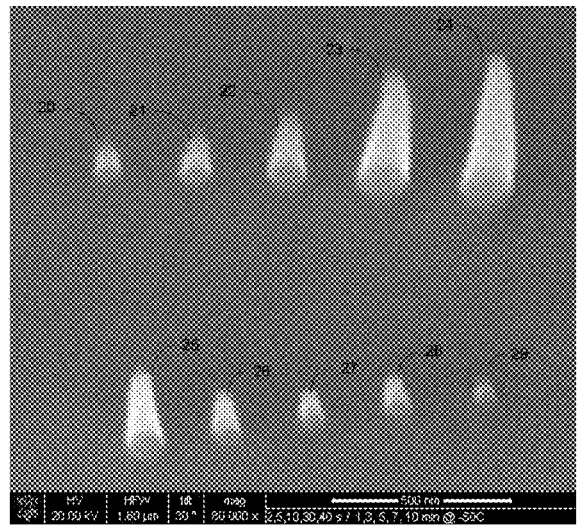
FIG. 2 is a photomicrograph showing deposition at −50° C. using hexane as precursor.

Hexane ($C_6H_{14}$), for example, has a melting point of −95° C., and Inventors have discovered that hexane will act as a standard precursor gas for carbon deposition at cryogenic temperatures down to around −85° C. FIG. 2 shows point deposits of carbon using hexane as precursor gas at −50° C. Reference numbers 20, 21, 22, 23, and 24 show carbon depositions at time intervals 2, 5, 10, 30 and 40 seconds, respectively. As shown in FIG. 2, the material deposited on the sample surface grows proportionately to the exposure time if the precursor gas supply remains constant. Reference numbers 25, 26, 27, 28, and 29 show depositions of one minute each after the precursor gas has been shut off (beginning with 25). This shows that the precursor gas is desorbing from the surface and being pumped away after the valve has closed.

Figure 3:
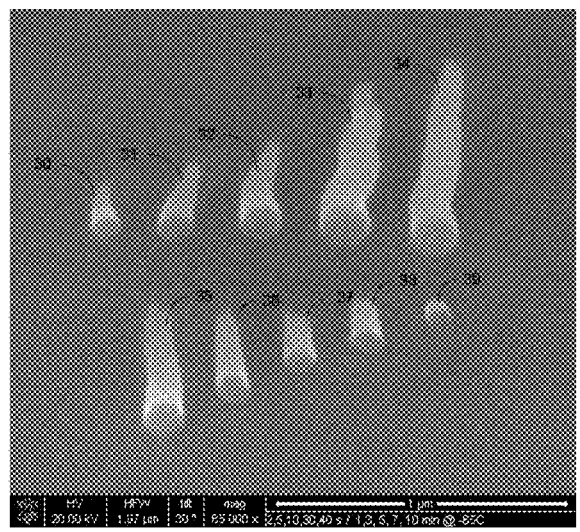
FIG. 3 is photomicrograph that shows EBID deposition at −65° C. using hexane as precursor.
Figure 4:
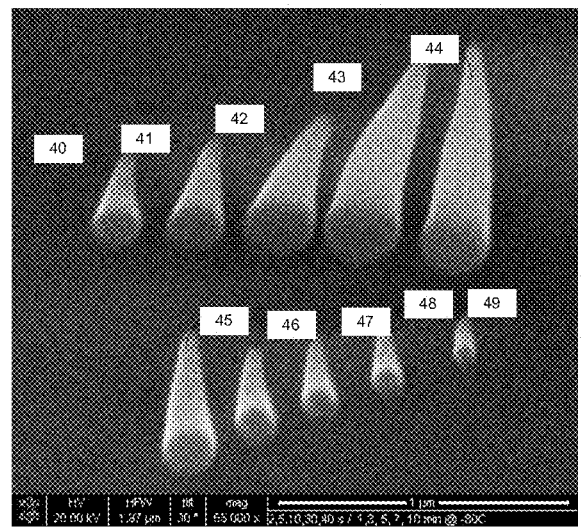
FIG. 4 is a photomicrograph that shows EBID at −80° C. using hexane as precursor.

FIGS. 3 and 4 show the same at −65° C. and −80° C., respectively. Thus, FIG. 3 shows point deposits of carbon using hexane as precursor gas at −65° C. Reference numbers 30 through 34 show carbon depositions at time intervals 2, 5, 10, 30 and 40 seconds, and reference numbers 35 through 39 show depositions of one minute each after the precursor gas has been shut off. In FIG. 4, reference numbers 40 through 44 are carbon depositions using hexane as precursor gas at −80° C. at time intervals 2, 5, 10, 30 and 40 seconds, respectively. Reference numbers 45 through 49 are the above depositions one minute each after the valve has closed and the chamber has been evacuated.

Figure 5:
FIG. 5 is a photomicrograph that shows a structure of two pads created by EBID at −85° C. using hexane as a precursor.

The predicted suitability of hexane as a precursor gas for deposition at temperatures approaching its melting point is confirmed by FIG. 5, which shows structures 51 and 52 connected by line 53 produced by EBID using hexane as precursor gas at −85° C. Below −95° C., hexane freezes onto the substrate and no longer works as a precursor for carbon deposition.

As illustrated by FIGS. 2-4, the amount of material deposited during the time intervals gets larger as the temperature gets colder. This is because the balance between adsorption and desorption of the precursor gas molecules onto the surface shifts as the temperature is lowered. More gas molecules will adsorb onto the surface and fewer will desorb, resulting in more gas molecules in a steady state balance ready for decomposition by the beam. Once the temperature is lowered too far, however, the balance will be lost. The gas molecules will then stay frozen on the surface resulting in the growth of a frozen film.

Inventors have also confirmed that other alkanes, for example propane ($C_3H_8$) and butane ($C_4H_{10}$), are also suitable for use as precursor gases for carbon deposition at cryogenic temperatures. Alkane molecules have bonds (from the C to the H) that can be decomposed by energy from the electron or ion beam to deposit carbon onto a substrate. Depending on the length of the chain of the alkane chain, this will work at different temperatures. For example, propane can be used as precursor gases for carbon deposition at −140° C., but hexane will freeze on the surface at that temperature; however, as stated above, hexane works as precursor at −95° C.

More specifically inventors found that, when using butane, at a substrate temperature of −130° C. a patterned deposit could be formed using EBID, but that at a temperature of −140° C. this was not possible anymore, and a homogeneous film of butane was formed on the substrate. At a temperature of −150° C. using propane, a patterned deposit could be formed, although the deposition rate was rather low. This shows that by choosing the correct precursor at specific working temperature, or choosing the correct working temperature when using a certain precursor, patterned deposits can be made at cryogenic temperatures.

Similar compounds with longer carbon chains or other functional groups are not as likely to be suitable precursors at cryogenic temperatures. For example, decane ($C_{10}H_{22}$) is such a large molecule that it only works as a deposition precursor closer to room temperatures. As —OH groups or COOH groups (carboxyl group) are added to compounds, the melting points and boiling points move up very quickly depending on the length of the group and the more complex groups. Because the adsorption of the gas molecule (sticking coefficient) appears to be proportional to the melting point of the gas compound, only a small number of carbon-containing one or two higher molecule groups with carbonyl (C=O) and hydroxyl (OH) groups will be suitable for use as a gas precursor at cryogenic temperatures. Based upon melting points, some alkenes such as ethylene ($C_2H_4$) and alkynes such as acetylene ($C_2H_2$) would also be suitable for use as a gas precursor at cryogenic temperatures, as would haloalkanes such as difluoromethane ($CH_2F_2$), fluorocarbons such as carbon tetrafluoride ($CF_4$), or haloforms such as carbon trifluoride ($CHF_3$).

It should be noted that there are a number of compounds having melting points in the appropriate range that would not be suitable for use as cryogenic deposition precursors. For example, fluorine, chlorine, oxygen, and nitrogen gases, as well as noble gases such as neon and argon, have very low melting points, but because these gases would be made up of separate atoms rather than molecules, they would not dissociate into a non-volatile product that could be deposited onto a substrate.

Figure 6:
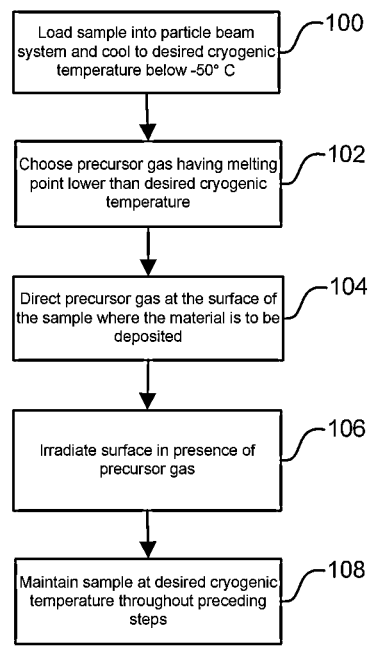
FIG. 6 is a flow chart showing the steps for carrying out a method of depositing a layer of material at cryogenic temperatures according to a preferred embodiment of the present invention.

FIG. 6 is a flow chart showing the steps for carrying out a method of depositing a layer of material at cryogenic temperatures according to a preferred embodiment of the present invention. In step 100, a sample is loaded into a suitable particle beam system and cooled to a desired cryogenic temperature. Persons of skill in the art will appreciate that both the particle beam system and the desired temperature will depend upon the particular application for the deposited material. For example, in order to prepare a TEM sample from a vitrified biological sample, the sample temperature should be maintained below −130° C. A suitable particle beam system for preparing the TEM sample could be, for example, a dual beam SEM/FIB system such as the one described below with reference to FIG. 7.

A suitable precursor gas is chosen in step 102 based upon the temperature of the sample. A suitable gas will have a melting point that is lower than the sample temperature. For example, where the sample temperature is −85° C., hexane, which has a melting point of −95° C., can be used as a precursor gas to deposit carbon. Where the sample temperature is −140° C., propane, which has a melting point of −188° C., can be used as a precursor gas to deposit carbon. Preferably, the melting point of the precursor gas will be lower than the desired sample temperature. More preferably, the melting point of the precursor gas will be at least 10 degrees centigrade lower than the desired sample temperature. A given precursor gas will typically be suitable for material deposition over a given temperature range, although deposition rates will typically increase as the temperature approaches the material's melting point. For example, hexane can be used as a precursor gas to deposit carbon over a temperature range of approximately −50° C. to −85° C., while propane can be used over a temperature range of approximately −50° C. to −180° C.

While the melting and/or freezing points for precursor gases are less sensitive to atmospheric pressure than boiling points, pressure does have an effect on the melting points of various suitable precursor gases. Because the samples will be under vacuum for charged particle beam processing, the "switch point" for a particular gas, i.e., the temperature at with the gas molecules no longer desorb from the surface, may not be identical to the material's melting point.

A suitable precursor gas will also be a compound having molecules that will dissociate in presence of the particle beam to form a deposit (a precipitate) and a gaseous by-product. Preferably, the by-product will also have a melting point that is also lower than the sample temperature so the by-product can be pumped away by the vacuum system.

Once a suitable precursor gas is chosen, in step 104 the precursor gas is directed at the surface of the sample where the material is to be deposited. Preferably, the precursor gas is directed at the surface through a gas-delivery needle or capillary to produce a local gas pressure in the mbar range. In one preferred embodiment, the vacuum pressure without the precursor gas would be approximately $3\times10^{-6}$ mbar, and with the precursor gas the pressure in the vacuum chamber would rise to approximately $5\times10^{-5}$ mbar.

Then in step 106, the particle beam is used to irradiate the surface wherever the deposit is to be formed. In preferred embodiments, a relatively high-energy electron beam can be used, for example 1-30 kV (more preferably 2-8 kV, most preferably 5 kV) and approximately 100 pA. As stated by step 108, the sample is maintained at the desired cryogenic temperature throughout steps 100 to 106.

The rate of local material deposition can be varied, but in preferred embodiments could be approximately 0.6 nm/sec over an area of 1 μm×1 μm. As the temperature is lowered and the adsorption/desorption balance shifts away from desorption, deposition speed will increase rapidly as the precursor gas approaches the temperature at which it begins to form a frozen film on the surface. The material deposition rate could rapidly change from the desired rate of approximately 0.6 nm/sec to roughly 1 μm/sec over a much larger area. As a result, higher deposition speeds must be balanced against the dangers of frozen gas build-up on the surface. At a given sample cryogenic temperature, there may be different compounds that might be suitable for material deposition. For example, both propane and hexane can be used where the sample temperature is in the range of −50° C. to −85° C. The material closest to its melting point will likely deposit material at a faster rate. In some cases, faster deposition might be desirable, while in others it might be preferably to use a precursor gas which deposited material at a slower rate but allowed more control.

Figure 7:
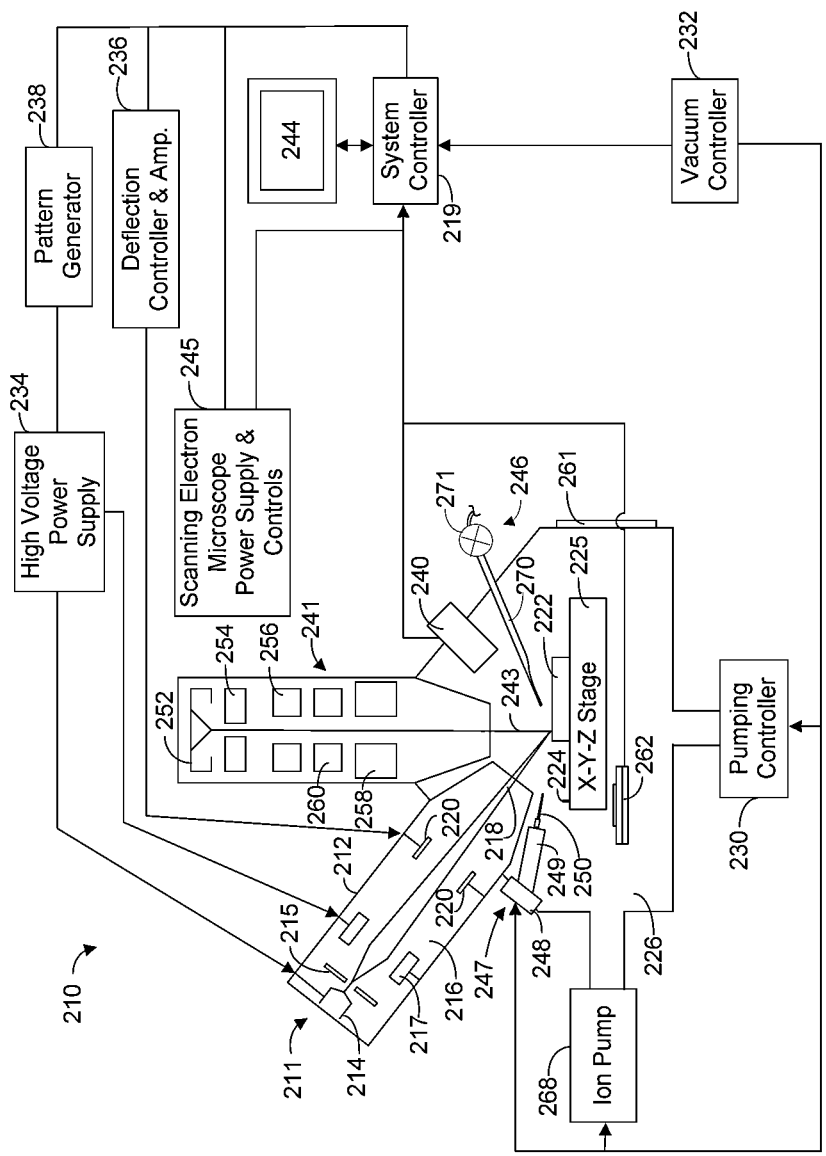
FIG. 7 depicts one embodiment of an exemplary dual beam SEM/FIB system that could be used to carry out the method of the present invention.

FIG. 7 depicts one embodiment of an exemplary dual beam SEM/FIB system 210 that is equipped to carry out a method according to the present invention. As discussed above, embodiments of the present invention can be used in a wide variety of applications where a material is deposited onto a target surface of a substrate, including the preparation of TEM samples from vitrified biological samples. Preparation and analysis of such a sample is typically performed in a dual beam electron beam/focused ion beam system such as the one now described. Suitable dual beam systems are commercially available, for example, from FEI Company, Hillsboro, Oreg., the assignee of the present application. While an example of suitable hardware is provided below, the invention is not limited to being implemented in any particular type of hardware.

Dual beam system 210 has a vertically mounted electron beam column and a focused ion beam (FIB) column mounted at an angle of approximately 52 degrees from the vertical on an evacuable specimen chamber 226. The specimen chamber may be evacuated by e.g. a turbo-molecular pump, or other known pumping means such as oil diffusion pumps, ion getter pumps, scroll pumps, etc.

The electron beam column 241 comprises an electron source 252 for producing electrons and electron-optical lenses 256, 258 forming a finely focused beam of electrons 243. The beam of electrons 243 can be positioned on and can be scanned over the surface of a substrate 222 by means of a deflection coil 260. Operation of lenses 256, 258 and deflection coil 260 is controlled by power supply and control unit 245. It is noted that lenses and deflection unit may use electric fields to manipulate the electron beam, or that magnetic fields may be used, or a combination thereof.

Electron beam 243 can be focused onto substrate 222, which is on movable X-Y-Z stage 225 within lower chamber 226. Stage 225 is cooled so that the sample can be kept at cryogenic temperatures. The cooling may be achieved with a Peltier unit, or for example by a thermal braid connected to a cold source such as a container containing a cryogenic fluid such as liquid nitrogen.

Mounted on the vacuum chamber is a Gas Injection System (GIS) 246. The GIS comprises a reservoir (not shown) for holding the precursor material and a needle 270 for directing the precursor material to the surface of the substrate. The GIS further comprises means 271 for regulating the supply of precursor material to the substrate. In this example, the regulating means are depicted as an adjustable valve, but the regulating means may also take the form of e.g. controlled heating of the precursor material.

When the electrons in the electron beam strike substrate 222, secondary electrons are emitted. These secondary electrons are detected by secondary electron detector 240, such as an Everhard-Thornley detector, or a semiconductor device capable of detecting low energy electrons. The signal of the detector is fed to a controller 219. Said controller also controls the deflector signals, lenses, electron source, GIS, stage and pump, and other items of the instrument. Monitor 244 is used to display an image of the substrate using the signal of the detector 219. STEM detector 262, located beneath the TEM sample holder 224 and the stage 225, can collect electrons that are transmitted through a sample mounted on the TEM sample holder.

Dual beam system 210 also includes focused ion beam (FIB) system 211 which comprises an evacuated chamber having an upper neck portion 212 within which are located an ion source 214 and a focusing column 216 including extractor electrodes and an electrostatic optical system. The axis of focusing column 216 is tilted 52 degrees from the axis of the electron column. The ion column 212 includes an ion source 214, an extraction electrode 215, a focusing element 217, deflection elements 220, and a focused ion beam 218. Ion beam 218 passes from ion source 214 through column 216 and between electrostatic deflection means schematically indicated at 220 toward substrate 222, which comprises, for example, a semiconductor device positioned on movable X-Y-Z stage 225 within lower chamber 226.

Stage 225 can also support one or more TEM sample holders 224 so that a sample can be extracted from the semiconductor device and moved to a TEM sample holder. Stage 225 can preferably move in a horizontal plane (X and Y axes)

and vertically (Z axis). Stage 225 can also tilt approximately sixty (60) degrees and rotate about the Z axis. In some embodiments, a separate TEM sample stage (not shown) can be used. Such a TEM sample stage will also preferably be moveable in the X, Y, and Z axes. A door 261 is opened for inserting substrate 222 onto X-Y-Z stage 225 and also for servicing an internal gas supply reservoir, if one is used. The door is interlocked so that it cannot be opened if the system is under vacuum.

An ion pump 268 is employed for evacuating neck portion 212. The chamber 226 is evacuated with turbomolecular and mechanical pumping system 230 under the control of vacuum controller 232. The vacuum system provides within chamber 226 a vacuum of approximately $3\times10^{-6}$ mbar. When a suitable precursor gas is introduced onto the sample surface, the chamber background pressure may rise, typically to about $5\times10^{-5}$ mbar.

High voltage power supply 234 is connected to liquid metal ion source 214 as well as to appropriate electrodes in ion beam focusing column 216 for forming an approximately 1 keV to 60 keV ion beam 218 and directing the same toward a sample. Deflection controller and amplifier 236, operated in accordance with a prescribed pattern provided by pattern generator 238, is coupled to deflection plates 220 whereby ion beam 218 may be controlled manually or automatically to trace out a corresponding pattern on the upper surface of substrate 222. In some systems, the deflection plates are placed before the final lens, as is well known in the art. Beam blanking electrodes (not shown) within ion beam focusing column 216 cause ion beam 218 to impact onto blanking aperture (not shown) instead of substrate 222 when a blanking controller (not shown) applies a blanking voltage to the blanking electrode.

The liquid metal ion source 214 typically provides a metal ion beam of gallium. The source typically is capable of being focused into a sub one-tenth micrometer wide beam at substrate 222 for either modifying the substrate 222 by ion milling, enhanced etch, material deposition, or for the purpose of imaging the substrate 222.

A micromanipulator 247, such as the AutoProbe 200™ from Omniprobe, Inc., Dallas, Tex., or the Model MM3A from Kleindiek Nanotechnik, Reutlingen, Germany, can precisely move objects within the vacuum chamber. Micromanipulator 247 may comprise precision electric motors 248 positioned outside the vacuum chamber to provide X, Y, Z, and theta control of a portion 249 positioned within the vacuum chamber. The micromanipulator 247 can be fitted with different end effectors for manipulating small objects. In the embodiments described herein, the end effector is a thin probe 250. As is known in the prior art, a micromanipulator (or microprobe) can be used to transfer a TEM sample (which has been freed from a substrate, typically by an ion beam) to a TEM sample holder for analysis.

A system controller 219 controls the operations of the various parts of dual beam system 210. Through system controller 219, a user can cause ion beam 218 or electron beam 243 to be scanned in a desired manner through commands entered into a conventional user interface (not shown). Alternatively, system controller 219 may control dual beam system 210 in accordance with programmed instructions.

According to a preferred embodiment of the present invention, a method of depositing a material onto a substrate at cryogenic temperatures, can comprise:

directing a precursor gas toward the substrate surface;

irradiating the substrate surface with a particle beam in the presence of the precursor gas, the precursor gas reacting in the presence of the particle beam to deposit material on the substrate surface;

characterized by cooling a substrate to desired cryogenic temperature below −50° C.;

the precursor gas being chosen from a group of compounds having a melting point that is lower than the desired cryogenic temperature.

According to preferred embodiments of the present invention, the precursor gas is chosen from a group of compounds having a melting point that closely approximates but is lower than the desired cryogenic temperature.

According to preferred embodiments of the present invention, the sample is a vitrified biological sample and the desired cryogenic temperature is lower than −130° C., in addition to the steps described above, the method can further comprise:

freeing a sample from the substrate using an ion beam;

moving a microprobe into contact with the sample;

directing the precursor gas toward the sample and irradiating the sample in the presence of the precursor gas to attach the sample to the microprobe;

lifting the microprobe with attached sample away from the substrate;

moving the microprobe so that the sample is in contact with a desired position on a sample holder;

directing the precursor gas toward the sample and irradiating the sample in the presence of the precursor gas to attach the sample to the microprobe;

separating the microprobe from the sample; and maintaining the sample at a temperature of −130° C. while the preceding steps are performed.

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable.

The present invention is applied to beam-induced processing, such as beam-induced deposition. The invention can be used with electron beams, ion beams, laser beams, cluster beams, and neutral particle beams. While the examples provided above describe primarily EBID to illustrate the invention, skilled persons can determine from those illustrations how to use the invention with other types of beams, and the invention is not limited to use with electron beams. For example, the invention can be used with an ion beam system having a liquid metal ion source or a plasma ion source. The terms "work piece," "sample," "substrate," and "specimen" are used interchangeably in this application unless otherwise indicated. As used herein, the term "cryogenic temperatures" will be used to refer to temperatures of −50° C. or lower.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of depositing a material onto a substrate at a selected cryogenic temperature in which the sample substrate is a vitrified biological sample and the selected cryogenic temperature is lower than −130° C., the method comprising:
    freeing a sample from the substrate using an ion beam;
    moving a microprobe into contact with the sample;
    directing a precursor gas toward the sample and irradiating the sample with a particle beam in the presence of the precursor gas to attach the sample to the microprobe;
    lifting the microprobe with attached sample away from the substrate;
    moving the microprobe so that the sample is in contact with a selected position on a sample holder;
    directing the precursor gas toward the sample and irradiating the sample with a particle beam in the presence of the precursor gas to attach the sample to the microprobe;
    separating the microprobe from the sample; and
    maintaining the sample at a temperature of −130° C. while the preceding steps are performed.

2. The method of claim 1 in which the precursor gas is chosen from a group of compounds having a melting point that is lower than the selected cryogenic temperature.

3. The method of claim 1 in which the melting point of the precursor gas is at least 10 degrees centigrade lower than the selected cryogenic temperature.

4. The method of claim 1 in which the precursor gas comprises a compound having molecules that will dissociate in the presence of the particle beam to form a deposit and a gaseous by-product.

5. The method of claim 4 in which the gaseous by-product includes molecules from a compound having a melting point that is lower than the substrate temperature.

6. The method of claim 1 in which the precursor gas is chosen from a group of compounds having a sticking coefficient that is less than 1.0 at the selected cryogenic temperature.

7. The method of claim 1 in which the precursor gas is chosen from a group of compounds having a sticking coefficient that is between 0.5 and 0.8 at the selected cryogenic temperature.

8. The method of claim 1 in which the precursor gas is chosen from a group of compounds which will reach an equilibrium between precursor molecules adsorbed onto the substrate surface and precursor gas molecules desorbing from the substrate surface at the selected cryogenic temperature.

9. The method of claim 8 in which the equilibrium is reached when one to two monolayers of gas molecules are formed on the substrate surface.

10. The method of claim 1 in which the precursor gas comprises propane.

11. The method of claim 1 in which the precursor gas comprises hexane.

12. The method of claim 1 in which the precursor gas comprises an alkane, an alkene, or an alkyne.

13. The method of claim 12 in which the precursor gas comprises ethylene or acetylene.

14. The method of claim 1 in which the precursor gas comprises a halo-alkane, a fluorocarbon, or a haloform.

15. The method of claim 14 in which the precursor gas comprises difluoromethane, carbon tetrafluoride, or carbon trifluoride.

16. The method of claim 1 in which the precursor gas decomposes in the presence of the radiation to deposit a material onto the sample at a rate of at least 0.6 nm/sec over an area of 1 $\mu m^2$ on the sample.

17. The method of claim 1 in which the precursor gas decomposes in the presence of the radiation to deposit a material that comprises carbon.

18. The method of claim 1 in which the particle beam comprises an electron beam having a beam energy of at least 5 keV.

19. The method of claim 1 in which the sample is attached to the microprobe after the sample has been separated from the substrate by directing the precursor gas toward the sample and irradiating the sample with a particle beam in the presence of the precursor gas.

* * * * *